United States Patent
Rath et al.

(10) Patent No.: US 9,362,939 B1
(45) Date of Patent: Jun. 7, 2016

(54) REDUCTION OF INPUT DEPENDENT CAPACITOR DAC SWITCHING CURRENT IN FLASH-SAR ANALOG-TO-DIGITAL CONVERTERS

(71) Applicant: TEXAS INSTRUMENTS INCORPORATED, Dallas, TX (US)

(72) Inventors: Shakti Shankar Rath, Karnataka (IN); Rishubh Khurana, Delhi (IN); Vineet Mishra, Karnataka (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/587,825

(22) Filed: Dec. 31, 2014

(51) Int. Cl.
   *H03M 1/14* (2006.01)
   *H03M 1/46* (2006.01)
   *H03M 1/00* (2006.01)
   *H03M 1/36* (2006.01)

(52) U.S. Cl.
   CPC .............. *H03M 1/145* (2013.01); *H03M 1/002* (2013.01); *H03M 1/361* (2013.01); *H03M 1/468* (2013.01)

(58) Field of Classification Search
   CPC ......... H03M 1/14; H03M 1/38–1/468; H03M 1/145
   USPC .................................. 341/156, 161–163, 172
   See application file for complete search history.

(56) References Cited

U.S. PATENT DOCUMENTS 5,675,340 A * 10/1997 Hester ..................... H03M 1/06
                                                                341/118
7,796,077 B2 * 9/2010 Mitikiri ................ H03M 1/145
                                                                341/118
8,310,388 B2 * 11/2012 Chang ................... H03M 1/145
                                                                327/337
8,587,466 B2 * 11/2013 Debnath ............... H03M 1/145
                                                                341/155

OTHER PUBLICATIONS

Lin et al, A 9-Bit 150-MS/s Subrange ADC Based on SAR Architecture in 90-nm CMOS, IEEE Transactions on Circuits and Systems—I: Regular Papers, vol. 60, No. 3, Mar. 2013.*
Xue et al., An 11-Bit 200MS/S SAR ADC IP for Wireless Comunacation SOC, 2014 12th IEEE International Conference on Solid-State and Integrated Circuit Technology (ICSICT), Oct. 28-31, 2014.*
Cho et al., A 9-bit 100-MS/s Flash-SAR ADC without Track-and-Hold Circuits, 2012 International Symposium on Wireless Communication Systems (ISWCS), Aug. 28-31, 2012, IEEE.*

* cited by examiner

*Primary Examiner* — Howard Williams
(74) *Attorney, Agent, or Firm* — John R. Pessetto; Frank D. Cimino

(57) ABSTRACT

Circuits and methods for reducing input dependent capacitor DAC switching current in flash-successive approximation register (SAR) analog-to-digital converters (ADCs) are disclosed. An ADC includes an M-bit flash ADC and N-bit SAR ADC. In flash conversion phase, flash ADC outputs digital signal including most significant M-bits of N-bits of digital output code for a sampled analog signal. SAR ADC includes capacitor DAC and digital engine. The capacitor DAC includes first and second set of capacitors, where first ends of the first and second set of capacitors are coupled to common terminal. The digital engine provides the N-bits of digital output code in SAR conversion phase based on the digital signal and a voltage (Vcom) at the common terminal. During flash conversion phase, second ends of the first set of capacitors are connected to Vref and Vgnd respectively so as to generate a voltage level corresponding to the digital signal as Vcom.

20 Claims, 6 Drawing Sheets

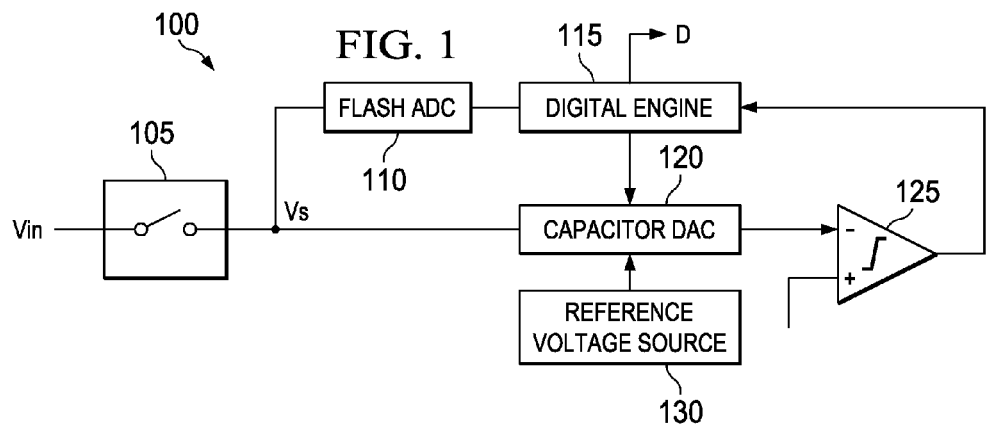
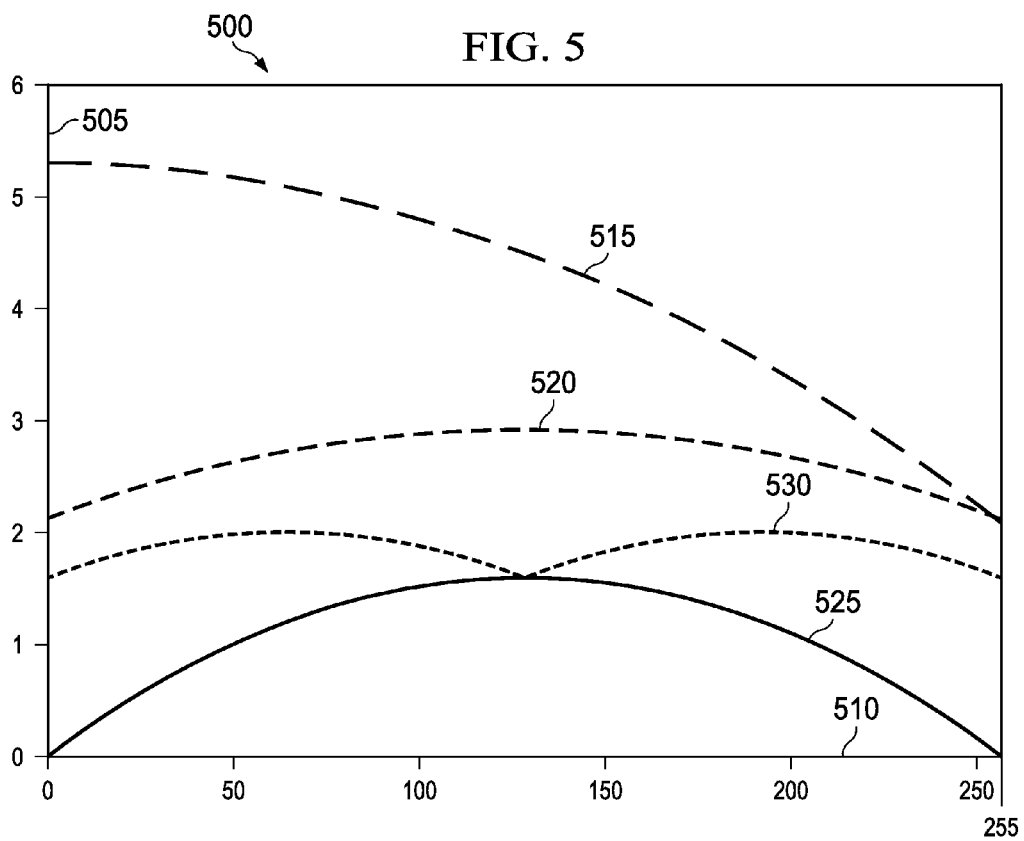

REDUCTION OF INPUT DEPENDENT CAPACITOR DAC SWITCHING CURRENT IN FLASH-SAR ANALOG-TO-DIGITAL CONVERTERS

TECHNICAL FIELD

The present disclosure generally relates to the field of reduction of input dependent capacitor DAC switching current in flash-successive approximation register (SAR) analog-to-digital converters (ADCs).

BACKGROUND

Various digital signal processing modules and electronic devices, especially used for communication, includes 'analog-to-digital converters' (ADCs) that are used to convert analog signals into a sequence of digital values (for example, 8 bit digital codes for a single level of an analog signal). There are many ways to implement ADCs, for example different types of ADCs may include flash ADCs, successive approximation register (SAR) ADCs, pipelined ADCs and the like. SAR ADCs are widely used for medium to high resolution conversions (resolution commonly ranging from 8 to 16 bits) with low power consumption characteristics. Such features make SAR ADCs ideal for a wide variety of applications, for example portable/battery-powered instruments, pen digitizers, industrial controls, and data/signal acquisition. In many scenarios, a combination of the flash SAR ADCs are also widely used to make a balance between speed and resolution, where few higher bits of the digital values are converted by flash ADC and remaining lower bits of the digital values are converted by a SAR ADC.

A typical SAR ADC of the flash SAR ADC includes a sample and hold (S/H) circuit to acquire and hold analog input voltage and to ensure that the analog input voltage that is acquired, remains constant during conversion. A capacitor digital-to-analog converter (DAC) is included in the SAR ADC to supply the analog input voltage to a comparator. The comparator compares input voltage received from the S/H circuit and input voltage received from the capacitor DAC and stores a result of comparison in a SAR. The comparator determines whether the analog input voltage obtained from the capacitor DAC is higher or lower than the analog input voltage received from the S/H circuit. The SAR provides the capacitor DAC with an approximation of a digital code, such that the output of the capacitor DAC provided to the comparator is an approximation of the analog input voltage. For example, the SAR ADC employs a binary search algorithm in a feedback loop for approximately determining digital values for the analog input voltage. The approximation is improved using a result of a previous comparison and the process is repeated until an entire digital word is decoded. However, high resolution requirement of the SAR ADC reduces speed of the SAR ADC. The SAR ADC are designed with different circuit configurations for increasing the speed, however such circuit configurations do not improve performance of the SAR ADC. Such configurations also fail to reduce unnecessary variation in switching current in the capacitor DAC caused by changes in signal levels of the analog input. As variation in the current drawn from a reference voltage source is more, it can deteriorate non-linearity (INL) performance of the SAR ADC.

SUMMARY

This Summary is provided to introduce a selection of concepts in a simplified form that are further described below in the detailed description. This Summary is not intended to identify key or essential features of the claimed subject matter, nor is it intended to be used as an aid in determining the scope of the claimed subject matter.

Various circuits and methods for reducing input dependent variation in capacitor DAC switching current in a flash-successive approximation register (SAR) analog-to-digital converter (ADC) are disclosed. An analog-to-digital converter (ADC) for converting an analog input signal into N-bits of digital output code includes an M-bit flash ADC and an N-bit successive approximation register (SAR) ADC. The M-bit flash ADC is configured to receive a sampled analog signal and to output a digital signal comprising most significant M-bits of the N-bits of digital output code in a flash conversion phase. The sampled analog signal is a stored signal of the analog input signal, where M and N are integers. The N-bit SAR ADC includes a capacitor digital-to-analog converter (DAC) and a digital engine. The capacitor DAC includes a first set of capacitors and a second set of capacitors. Each of the first set of capacitors and the second set of capacitors are weighted capacitors, and first ends of each capacitor of the first set of capacitors and the second set of capacitors are coupled to a common terminal. Each switch of the plurality of switches is in one-to-one correspondence with capacitors of the first set of capacitors and the second set of capacitors. The digital engine is coupled to the M-bit flash ADC and the capacitor DAC for providing the N-bits of digital output code in a SAR conversion phase based on the digital signal and a voltage (Vcom) at the common terminal. The digital engine is configured to, in the flash conversion phase, generate the most significant M-bits of the N-bits of digital output code based on the digital signal received from the M-bit flash ADC and to connect second ends of the first set of capacitors to a reference signal (Vref), and connect second ends of the second set of capacitors to a ground reference signal (Vgnd). The digital engine is configured to, in a first cycle of the SAR conversion phase, connect second ends of one or more capacitors of the first set of capacitors to the Vgnd if a voltage level corresponding to the digital signal is less than Vref/2, and connect second ends of one or more capacitors of the second set of capacitors to the Vref if a voltage level corresponding to the digital signal is greater than Vref/2 so as to generate the voltage level corresponding to the digital signal as the Vcom. The digital engine is further configured to, in subsequent cycles of the first cycle of the SAR conversion phase, control voltage levels at the second ends of the second set of capacitors to perform successive approximation of least significant N-M bits of the N-bits of digital output code based on a SAR conversion algorithm.

In another embodiment, a method of converting an analog input signal into N-bits of digital output code is disclosed. The method includes receiving a sampled analog signal, the sampled analog signal being a stored signal of the analog input signal. The method includes performing a flash conversion phase by generating a digital signal comprising M most significant bits of the N-bits of digital output code by a M-bit flash analog-to-digital converter (ADC). Additionally, the flash conversion phase is performed by connecting first ends of a first set of capacitors and a second set of capacitors to a common terminal, connecting second ends of the first set of capacitors to a reference signal (Vref), and connecting second ends of the second set of capacitors to a ground reference signal (Vgnd), each of the first set of capacitors and the second set of capacitors being weighted capacitors. The method further includes performing a successive approximation register (SAR) conversion phase by, in a first cycle of the SAR conversion phase, connecting second ends of one or more capacitors of the first set of capacitors to the Vgnd if a voltage level corresponding to the digital signal is less than Vref/2, and connecting second ends of the one or more capacitors of the second set of capacitors to the Vref if the voltage level corresponding to the digital signal is greater than Vref/2 so as to generate the voltage level corresponding to the digital signal at the common terminal. Additionally, the SAR conversion phase is performed by, in subsequent cycles of the first cycle of the SAR conversion phase, controlling voltages at the second ends of the second set of capacitors to perform successive approximation of least significant N-M bits of the N-bits of digital output code based on a SAR conversion algorithm.

Other aspects and example embodiments are provided in the drawings and the detailed description that follows.

BRIEF DESCRIPTION OF THE FIGURES

FIG. 1 is a circuit diagram of an analog-to-digital converter (ADC), in accordance with an example scenario;

FIG. 5 is a graphical representation illustrating variation of average charge drawn by capacitor DACs in example ADCs with respect to an analog input signal.

Figure 2:
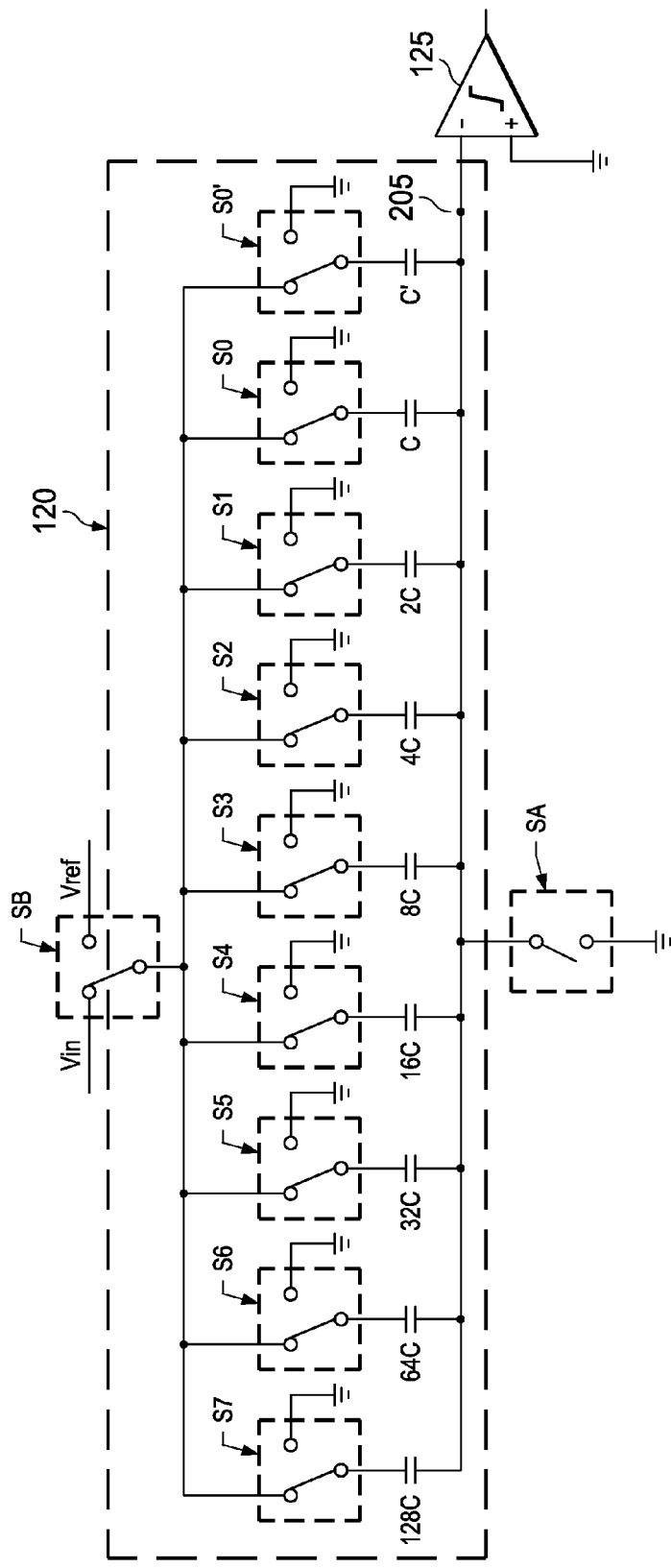
FIG. 2 is a circuit diagram of a capacitor digital-to-analog converter (DAC) in the ADC of FIG. 1, in accordance with an example scenario.

The drawings referred to in this description are not to be understood as being drawn to scale except if specifically noted, and such drawings are only exemplary in nature.

DETAILED DESCRIPTION

Digital signal processing modules and electronic devices, especially used for communication, include 'analog-to-digital converters' (ADCs) that are used to convert analog signals into a sequence of digital values. ADCs are implemented in several configurations, for example different types of ADCs can include flash ADCs, successive approximation register (SAR) ADCs, pipelined ADCs and the like. Flash ADCs are used for high speed conversion of analog signals to digital outputs and exhibit low resolution characteristics. Flash ADCs find use in applications which require high speed analog to digital conversions. The applications can include, but are not limited to, optical and magnetic storage systems, ultra wide band (UWB) receivers, satellite receivers and the like. SAR ADCs are widely used for medium to high resolution conversions (resolution commonly ranging from 8 to 16 bits) with low power consumption characteristics. Such features make SAR ADCs ideal for a wide variety of applications, for example portable/battery-powered instruments, pen digitizers, industrial controls, and data/signal acquisition. However, high resolution requirements of the SAR ADCs reduces speed of the SAR ADC.

To increase the speed of a SAR ADC, a flash ADC is combined with the SAR ADC as a hybrid ADC architecture. Typically, some MSBs are converted by the flash ADC and remaining bits are converted by the SAR ADC. Hence, by combining speed of the flash ADC and the high resolution of the SAR ADC, an improved ADC architecture is obtained. However, performance of the SAR ADC is reduced due to high switching current drawn inside the hybrid ADC architecture. To reduce the high switching current in the SAR ADC, various techniques exist in prior art, for example techniques can include, but are not limited to, a charge recycling technique, a front-end flash technique, a thermometric digital-to-analog converter (DAC) coding technique and the like. However, performance of the hybrid ADC architecture can still be improved. An example ADC, a hybrid ADC architecture (that is not in accordance with example embodiments of the present invention), is explained with reference to FIG. 1 and a capacitor DAC that is used in the hybrid ADC architecture of FIG. 1, is explained with reference to FIG. 2. An example ADC (that is in accordance with example embodiments of the present invention) is explained with reference to FIG. 3, and associated capacitor DACs are explained with reference to FIGS. 4A and 4B.

FIG. 1 is a circuit diagram of an analog-to-digital converter (ADC), in accordance with an example scenario. In this example scenario, an ADC 100, for example an N-bit ADC, is shown that is designed to convert an analog input signal (see, Vin) to N-bits of digital output code 'D'. The ADC 100 includes a sample and hold circuit 105, a flash ADC 110, a digital engine 115, a capacitor digital-to-analog converter (DAC) 120, a comparator 125 and a reference voltage source 130. In an example, the digital engine 115, the capacitor DAC 120, and the comparator 125 together form a successive approximation register (SAR) ADC. The ADC 100 is a hybrid ADC that includes a cascade connection of the flash ADC 110 and the SAR ADC. In an example, few of the most significant bits (MSBs), for example most significant M-bits of the N-bits of the digital output code 'D' corresponding to the analog input signal Vin, are converted using the flash ADC 110 and remaining bits (least significant N-M bits) of the N-bits of the digital output code 'D' corresponding to Vin are converted using the SAR ADC. It should be noted that sampled analog signal (referred to as 'Vs') is used to refer to value of an analog input signal that can be converted into the N-bits of the digital output code 'D'. The N-bits of digital output code 'D', at any given instant, represents a signal value approximately equal to the sampled signal value of the analog input signal (Vin). For example, each bit of the N-bits of the digital output code 'D' represents a particular signal value, and summation of signal values represented by all bits of the N-bits of the digital output code 'D' approximates the sampled signal value of the analog input signal (Vin).

The sample and hold circuit 105 (also referred to as S/H circuit 105) is configured to sample and hold the analog input signal (referred to as Vin) and provide a sampled analog signal (Vs), for example a temporarily stored signal of the analog input signal Vin. In one form, the S/H circuit 105 includes a switch and a capacitor and can be configured to sample the Vin to generate the sampled analog signal (Vs). For instance, the opening or closing of the switch can be controlled to sample the Vin in a sample phase to generate the Vs and retain the Vs till a next sampling of the Vin is performed.

The flash ADC 110, for example an M-bit flash ADC, is coupled to the S/H circuit 105 and is configured to output a digital signal that includes M MSBs of the N-bits of the digital output code 'D' corresponding to the sampled analog signal Vs. In an example, the flash ADC 110 is a binary-weighted flash converter that includes multiple comparators in parallel to sample the Vs. For instance, the flash ADC 110 can provide 5 MSBs of a 16-bit digital output code corresponding to the Vs.

The digital engine 115 (also referred to as a SAR controller) is coupled to the flash ADC 110 and is configured to receive the digital signal including the most significant M-bits (hereinafter represented as M MSBs), for example 5 MSBs, corresponding to the Vs. The digital engine 115 is further configured to provide a control signal to the capacitor DAC 120 based on the digital signal. In an example, the digital engine 115 includes an N-bit register, for example, a 16-bit register to provide a digital output code 'D'. In an example, states of the first five bits of the 16-bit register is controlled based on the digital signal received from the flash ADC 110, and states of the remaining 11 bits of the 16-bit register is set based on applying successive approximation technique on the capacitor DAC 120 and the comparator 125 by the digital engine 115.

The capacitor DAC 120 is coupled to the digital engine 115 to receive the control signal. In an example, the capacitor DAC 120 is a successive approximation DAC or a cyclic DAC. The capacitor DAC 120 includes a plurality of binary weighted capacitors that are configured to generate a DAC voltage (referred to as Vcom) at a common terminal based on charging different capacitors with a reference voltage (referred to as Vref), where the Vcom can be generated as different fractions of Vref. The reference voltage Vref is provided by the reference voltage source 130. A configuration of the capacitor DAC 120 is described with reference to FIG. 2.

The comparator 125 is coupled to the capacitor DAC 120 and the digital engine 115. A first input terminal of the comparator 125 receives the sampled analog signal (Vs) and a second input terminal of the comparator 125 receives the Vcom. The comparator 125 is configured to compare the Vcom with the Vs to generate an output signal. The output signal of the comparator 125 is provided to the digital engine 115 as a feedback signal. The digital engine 115 now generates the control signal based on the output signal of the comparator 125 and provides the control signal to the capacitor DAC 120 to control connections of the capacitors in the capacitor DAC 120. The capacitor DAC 120 and the digital engine 115 together provide an approximation of the analog input signal Vin. The comparator 125 determines whether the approximation is higher than the Vin or lower than the Vin. The approximation is improved based on a result of a last comparison, and such a process is repeated until an entire digital word is decoded and provided as the digital output code 'D'. An example of the capacitor DAC 120 used in the SAR ADC of FIG. 1 is described in FIG. 2.

FIG. 2 is a circuit diagram of a capacitor DAC, for example the capacitor DAC 120, within an ADC, for example the ADC 100, in accordance with an example scenario. The capacitor DAC 120 is shown as an 8-bit capacitor DAC coupled to the comparator 125 (refer FIG. 1) at the second input terminal of the comparator 125. The first input terminal of the comparator 125 is configured to receive the sampled analog signal (Vs). The capacitor DAC 120 includes a capacitor array of 8 capacitors with binary weighted values (also referred to as binary weighted capacitors), for example capacitors C, 2C, 4C, 8C, 16C, 32C, 62C and 128C, in addition to a dummy least significant bit (LSB) capacitor, for example C'. The capacitance of the dummy capacitor C' is same as a least significant bit capacitor C. In the capacitor DAC 120, a first end of the dummy LSB capacitor C', and first ends of each of the binary weighted capacitors (C, 2C, 4C, 8C, 16C, 32C, 64C and 128C) are coupled to a common terminal 205, and the common terminal 205 is coupled to the second input terminal of the comparator 125. In the capacitor DAC 120, free terminals of the binary weighted capacitors (C, 2C, 4C, 8C, 16C, 32C, 64C and 128C) are selectively coupled to voltage rails Vin or Vref (through a switch SB) or to ground (through a switch SA) based on respective switches, for example switches S0, S1, S2, S3, S4, S5, S6, and S7, in respective manner, depending upon a cycle of conversion of Vs to the digital output code D. The dummy capacitor C' is also selectively coupled to either Vin or Vref (through the switch SB) or to ground (through the switch SA), for example, Vgnd based on a respective switch S0'.

In an example, conversion by the capacitor DAC 120 can be understood in three phases. In a first phase (also referred to as a sampling phase or an acquisition phase), the common terminal 205 is coupled to the Vgnd (for example, the switch SA is closed), and all free terminals of the binary weighted capacitors (C to 128C) and the dummy capacitor C' are coupled to the sampled analog signal Vs through the respective switches S0, S1, S2, S3, S4, S5, S6, S7 and S0', respectively, and the switch SB. The binary weighted capacitors (C to 128C) and the dummy LSB capacitor are charged with a charge proportional to the sampled analog signal Vs.

In the second phase (also referred to as a hold phase), the common terminal 205 is disconnected from the ground (for example, the switch SA is opened) and the free terminals of the binary weighted capacitors (C to 128C) and the dummy capacitor C' are disconnected from Vin, thereby trapping the charge on the capacitor array. The free terminals of the binary weighted capacitors (C to 128C) and the dummy capacitor C' are then coupled to the ground (for example, by coupling the switches S0-S7 and S0' to the ground). Such coupling of the switches S0-S7 and S0' drives the voltage at the common terminal 205 (Vcom) as equal to −Vin and such voltage (−Vin) is further fed to the second input terminal of the comparator 125.

In the third phase (also known as a redistribution phase), individual capacitors of the capacitor array are coupled to either the Vref or Vgnd as per the control signal received from the digital engine 115. For instance, if the flash ADC 110 provides conversion for the three MSBs corresponding to the Vs, the switches S7, S6 and S5 are controlled based on the control signal received from the digital engine 115. For instance, if a 3-bit output of the flash ADC is '010', the switch S7 is coupled to the ground, the switch S6 is coupled to Vref, and the switch S5 is coupled to the ground. As 3 bits ($D_7$, $D_6$ and $D_5$) of the digital output code 'D' (for example, D including 8 bits "$D_7D_6D_5D_4D_3D_2D_1D_0$") are already received from the flash ADC 110, the remaining 5 bits (for example, $D_4$, $D_3$, $D_2$, $D_1$ and $D_0$) are converted by the SAR ADC including the capacitor DAC 120 and the digital engine 115. For instance, a next MSB (for example, $D_4$) is checked for the conversion, and the switch S4 is coupled to Vref, and Vcom is compared against the ground (effectively comparing the Vin to a combined voltage (Vcom) generated by the capacitors). If the comparator output is 0 (indicating that the Vcom is less than ground), the S4 is maintained as coupled to the Vref, however, if the comparator output is 1 (indicating that the Vcom is more than ground), the S4 is brought down to Vgnd. In a next clock cycle, the next MSB (for example, D3) is checked for the conversion, and thereafter, the $D_2$ and so on till the $D_0$.

It should be noted that the capacitor DAC 120 includes the binary weighted array of capacitors which encounter various issues with respect to switching current. For example, the 8-bit capacitor DAC as shown in FIG. 2 includes 9 capacitors (C-128C, and C') that are charged and discharged from the reference voltage source 130 depending upon a signal level of Vs. The binary weighted array of capacitors switches to intermediate voltage levels between Vref (for example, an up transition) and Vgnd (for example, a down transition). During every switching, up transitions and down transitions occur for every bit cycle and there is a lot of switching involved. Such unnecessary switching due to changes in the input signal (for example, sampled analog signal) leads to a greater variation in charges (or excessive switching current) drawn from the reference voltage source 130 (also referred to as a reference buffer). Such excessive variation in the charges (or current) drawn from the reference voltage source 130 tends to deteriorate the reference voltage source 130 that also leads to error in the capacitor DAC 120 in form of integral non-linear (INL) error. For instance, the excessive switching current of the capacitor DAC 120 based on the changes in the sampled analog signal (also termed as "input dependent capacitor DAC switching current") increases variation in average switching current drawn from the reference voltage source 130 into the capacitor DAC 120. Hence, lower switching current received from the reference voltage source 130 (for example, at input) and a low difference between a maximum charge and a minimum charge needed by the capacitor array in the capacitor DAC 120, during the ADC conversion is desirable for improving the efficiency of the ADC 100.

Various embodiments of the present disclosure provide solutions that are capable of reducing variation of the input dependent switching current that is drawn from the reference voltage source 130 and reducing instances of charging and discharging of the capacitors in the capacitor DAC 120 for controlling the INL error in the flash SAR ADCs; and such solutions are capable of overcoming the above described and other limitations, in addition to providing currently available benefits. As such solutions are capable of overcoming the above limitations, which can be appreciated in comparison with example scenario implementations of FIGS. 1 and 2, and accordingly such solutions are described next. Several aspects of the present disclosure address one or more of the problems noted above, as described next with respect to example embodiments in FIGS. 3 to 6, and that can be appreciated in comparison with the example scenarios of FIGS. 1 and 2.

Figure 3:
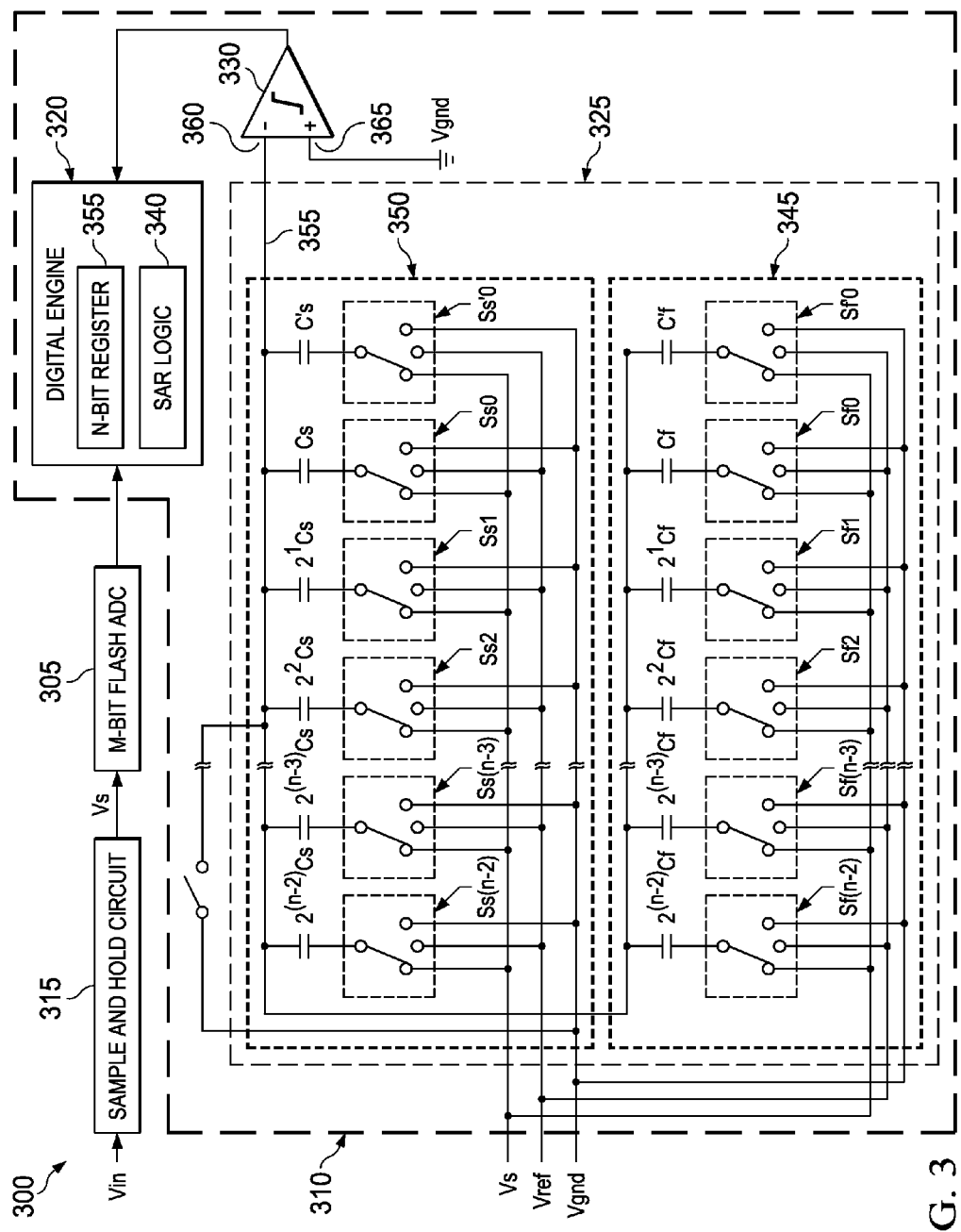
FIG. 3 is a circuit diagram of an ADC, in accordance with an example embodiment.

Referring now to FIG. 3, a circuit diagram of an analog-to-digital converter (ADC) 300 is shown, in accordance with an example embodiment of the present disclosure.

The ADC 300 includes an M-bit flash ADC 305 (hereinafter referred to as 'flash ADC 305') and a successive approximation register (SAR) ADC 310. The flash ADC 305 is an M-bit ADC that converts most significant M-bits (M MSBs) of a sampled analog signal (referred to as Vs). Herein, the 'SAR ADC' 310 refers to a converter that generates a digital output code representative of strength of an analog input signal Vin (at a sampled time instance) through a binary search process (for example, based on a SAR conversion algorithm) through all possible quantization levels corresponding to various fractions of Vref. Herein, in an example embodiment, Vref is a maximum voltage level of Vin. The sampled analog signal Vs is a stored signal of an analog input signal (referred to as Vin) that needs to be converted to the digital output code 'D'. In an example embodiment, the ADC 300 includes a sample and hold circuit 315 (also referred to as S/H circuit 315) which is configured to sample and hold the analog input signal Vin and provide the sampled analog signal Vs. In one form, the S/H circuit 315 includes a switch and a capacitor that are configured to sample the analog input signal Vin to generate the sampled analog signal Vs. For instance, opening or closing of the switch can be controlled to sample the Vin in a sample phase and retain the Vin till a next sampling of the analog input signal Vin.

The flash ADC 305 is coupled to the S/H circuit 315 and is configured to output a digital signal that includes the M MSBs of the 'D' corresponding to the sampled analog signal Vs. In an example, the flash ADC 305 is a binary-weighted flash converter that includes multiple comparators in parallel to sample the analog input signal Vs. For instance, the flash ADC 305 can be configured to convert 3 MSBs of 8-bits of digital output code 'D' corresponding to the Vs.

In general, some MSBs, for example M-bits (of N-bits of digital output code 'D' corresponding to the Vs) of Vs, are converted using the flash ADC 305 in a single cycle, and remaining bits (for example, least significant N-M bits) of the Vin are converted using the SAR ADC 310. The SAR ADC 310 is coupled to the flash ADC 305 and includes a digital engine 320, a capacitor digital-to-analog converter (DAC) 325 (hereinafter referred to as 'DAC 325'), and a comparator 330.

The digital engine 320 (also referred to as a SAR controller) is coupled to the flash ADC 305 and is configured to receive the digital signal including the M MSBs (for example 3 MSBs) of the digital output corresponding to the Vs. The digital engine 320 is configured to determine value of each bit of digital output code 'D' via the DAC 325 in a sequential manner based on an output signal of the comparator 330. The digital engine 320 is further configured to provide a control signal to the DAC 325 based on the digital signal and the output signal. The digital engine 320 is further configured to provide the digital output code 'D', for example the 8-bit digital output code. In an example, the digital engine 320 can be designed using different architectures. In one form, the digital engine 320 includes an N-bit register 335 and a SAR logic 340. The N-bit register 335 is initialized based on the digital signal received from the flash ADC 305, for example, the first M MSBs of the D are determined based on the digital signal and the remaining least significant N-M bits of the N-bit register 335 are determined based on the output signal of the comparator 330. The control signal is generated from the SAR logic 340 in each stage of conversion of the N-M bits so as to control the conversion of N-M bits by the DAC 325.

The DAC 325 (a capacitor DAC) is coupled to the digital engine 320. In an example, the DAC 325 is a successive approximation DAC. The DAC 325 includes a plurality of binary weighted capacitors that are configured to generate a DAC voltage at a common terminal (referred to as Vcom) based on selectively charging and discharging various capacitors by connecting/disconnecting to a reference voltage (referred to as Vref). In an example, the reference voltage (Vref) is provided by a reference voltage source (not shown in FIG. 3). An example of the reference voltage source may be the reference voltage source 130 (see, FIG. 1). An example configuration of the DAC 325 is also described with reference to FIGS. 4A and 4B.

The DAC 325 includes a first set of capacitors 345 and a second set of capacitors 350, coupled to each other. The first set of capacitors 345 includes a first array of binary weighted capacitors, for example, Cf, $2^1$Cf, $2^2$Cf, $2^3$Cf . . . $2^{(n-3)}$Cf, $2^{(n-2)}$Cf, and a first dummy capacitor C'f. The second set of capacitors 350 includes a second array of binary weighted capacitors, for example, Cs, $2^1$Cs, $2^2$Cs, $2^3$Cs . . . $2^{(n-3)}$Cs, $2^{(n-2)}$Cs, and a second dummy capacitor C's. It should be noted that capacitances of the first array of binary weighted capacitors are equal to respective capacitances of the second array of binary weighted capacitors. In the DAC 325, an end of each capacitor of the first set of capacitors 345 and the second set of capacitors 350 are coupled to a common terminal (shown as 355) and the common terminal 355 is coupled to the second input terminal 360 of the comparator 330. Other end of each capacitor of the first set of capacitors 345 and the second set of capacitors 350 is a free terminal, and free terminals of the capacitors are selectively connected to Vin, a reference signal (Vref) or a ground reference signal (for example, Vgnd) based on respective switches. For instance, in an example embodiment, switches Sf'0, Sf0, Sf1, Sf2, . . . Sf(n−3), Sf(n−2) control connections of free terminals of the capacitors C'f, Cf, $2^1$Cf, $2^2$Cf . . . $2^{(n-3)}$Cf and $2^{(n-2)}$Cf, respectively, in the first set of capacitors 345. In an example embodiment, each of the capacitors C'f, Cf, $2^1$Cf, $2^2$Cf . . . $2^{(n-3)}$Cf and $2^{(n-2)}$Cf can individually be either coupled to the Vin, Vref or the Vgnd depending upon a state of respective switches coupled at the free terminals of the capacitors in the first set of capacitors 345. Similarly, in this example embodiment, switches Ss'0, Ss0, Ss1, Ss2 . . . Ss(n−3), Ss(n−2) control connections of free terminals of the capacitors C's, Cs, $2^1$Cs, $2^2$Cs . . . $2^{(n-3)}$Cs and $2^{(n-2)}$Cs, respectively, in the second set of capacitors 350. In an example embodiment, each of the capacitors C's, Cs, $2^1$Cs, $2^2$Cs . . . $2^{(n-3)}$Cs and $2^{(n-2)}$Cs can individually be either coupled to the Vin, Vref or the ground depending upon a state of respective switches coupled at the free terminals of the capacitors in the second set of capacitors 350. It should be noted that the first set of capacitors 345 together represent the MSB of the N-bit 'D' which is also referred to as an MSB capacitor (providing a voltage equivalent of Vref/2). For example, if each capacitor of the first set of capacitors 345 is connected to the Vref, a voltage level contributed at the Vcom due to the first set of capacitors 345 is equal to Vref/2 that is an approximation of the MSB of the 'D', for example, $D_{n-1}$, where D is a N-bit code represented as $D_{n-1}D_{n-2} \ldots D_1D_0$. Similarly, each capacitor of the second set of capacitors 350 provides an approximation of a corresponding bit of the 'D'. For example, if the free terminal of the capacitor $2^{(n-2)}$Cs is connected to Vref, a voltage level contributed at the Vcom due to the capacitor $2^{(n-2)}$Cs is equal to Vref/4 that is an approximation of the '$D_{n-1}$' of 'D', Similarly, the capacitor $2^{(n-3)}$Cs is capable of generating Vref/8 at the Vcom and may be used for the approximation of '$D_{n-2}$' of 'D', and so on.

The comparator 330 is coupled between the DAC 325 and the digital engine 320. In one form, the comparator 330 includes a preamplifier and a latch. A first input terminal 365 of the comparator 330 receives the Vgnd and the second input terminal 360 of the comparator 330 receives the Vcom from the common terminal 355 of the DAC 325. The comparator 330 is configured to compare the Vcom with the Vgnd and based on the comparison, generates an output signal. The output signal of the comparator 330 is provided to the SAR logic 340 of the digital engine 320 as a feedback signal. The SAR logic 340 now updates the N-bit register 335 and enables updation of the control signal based on the output signal of the comparator 330. The control signal is provided to the DAC 325 to control connections of switches in order to generate voltage at the Vcom as per the SAR conversion algorithm by the capacitors (of the first set of capacitors 345 and the second set of capacitors 350) of the DAC 325. The DAC 325 and the digital engine 320 together provide an approximation of the analog input signal Vin. The comparator 330 determines whether the approximation is higher than the Vin or lower than the Vin. The approximation is improved based on a result of a last comparison, and such a process is repeated until all bits of the digital output code 'D' are generated.

An example explanation of working of the ADC 300 is now described with reference to FIG. 3 and includes finding a DAC level that best approximates the sampled analog signal Vs. The S/H circuit 315 receives an N-bit analog input signal Vin. The S/H circuit 315 samples and holds the Vin at periodic time intervals and outputs the sampled analog signal Vs to the flash ADC 305. The flash ADC 305 is an M-bit flash ADC that is configured to receive the sampled analog signal Vs and generates the digital signal (that is an M-bit output including M MSBs of the N-bits of the digital output code 'D' corresponding to Vs). The conversion of the digital output code 'D' may be explained in one or more cycles, for example, a sampling cycle, a first cycle, a second cycle and one or more redistribution cycles.

In the sampling cycle, the −Vin is trapped at the Vcom of the DAC 325, in the manner as described with reference to FIG. 2. Herein, the sampling cycle includes the sample mode and the hold mode as described with reference to FIG. 2.

In the first cycle (a flash conversion mode), the M-bits of the D are obtained by the flash ADC 305. In the first cycle, the control signal (the digital code) is generated by the SAR logic 340 for the DAC 325 such that the switches Sf'0, Sf0, Sf1, Sf2, . . . Sf(n−2) enable the capacitors C'f, Cf, $2^1$Cf, $2^2$Cf . . . and $2^{(n-2)}$Cf of the first set of capacitors 345 to be coupled (or pre-charged) to Vref. Further, in the first cycle (during the conversion of the M MSBs by the flash ADC 305), the control signal also enables the capacitors C's, Cs, $2^1$Cs, $2^2$Cs . . . and $2^{(n-2)}$Cs of the second set of capacitors 350 to be coupled to the Vgnd by controlling connections of the switches Ss'0, Ss0, Ss1, Ss2 . . . Ss(n−2). Hence, during the conversion of the M MSBs of 'D', such connections of the first set of capacitors 345 and the second set of capacitors 350 configures the Vcom to be equal to Vref/2-Vs. As a result of the flash ADC 305 converting the M MSBs of the 'D', the N-bit register 335 is updated according to the digital signal. For instance, M MSBs of the N-bit register 335 are updated based on the digital signal. For example, if M is 3 and N is 8, and if the digital signal represents a value of '110', the N-bit register 335 is updated as '110XXXXX', where 'X' represents a default value that may be stored for the 5 LSBs, as the 5 LSBs are still to be converted by the SAR ADC 310. It should be noted that 'X' can be either '1' or '0' depending upon the implementation.

In the second cycle, the control signal is subsequently generated by the SAR logic 340 to enable the connections of the first set of capacitors 345 and the second set of capacitors 350 to either Vref or Vgnd, such that the voltage at the common terminal 355 (Vcom) reflects a voltage level according to the digital signal provided by the flash ADC 305. In an example embodiment, if the digital engine 320 determines that the voltage level according to the digital signal of the flash ADC 305 is less than Vref/2, charge recycling is performed within the first set of capacitors 345, where one or more capacitors of the first set of capacitors 345 are disconnected from Vref and coupled to ground (or switched to 0V) so as to realize the voltage corresponding to the digital signal at the Vcom. In this example embodiment, if the digital engine 320 determines that the voltage level corresponding to the digital signal of the flash ADC 305 is more than Vref/2, the first set of capacitors 345 are maintained as connected to the Vref, and one or more capacitors of the second set of capacitors 350 are connected from Vref so as to realize the voltage corresponding to the digital signal as the Vcom.

In the redistribution cycle, conversion of the remaining bits (N-M) of the 'D' is performed as per the SAR conversion algorithm. For instance, a next capacitor of the second set of capacitors 350 is coupled to the Vref to generate a new Vcom that is compared with the Vgnd to approximate the Vs. For example, the generated Vcom is compared with the Vgnd by the comparator 330. If the Vcom is greater than the Vgnd, the output signal of the comparator 330 is low (equal to logic 0) and the control signal generated from the SAR logic 340 is configured to connect a last connected capacitor back to ground and connect a next lowest capacitor to Vref. However, if the Vcom is less than the Vgnd, the output signal of the comparator 330 is high (equal to logic 1) and the control signal generated from the SAR logic 340 is configured to maintain the connection of the last connected capacitor to Vref and connect a next lowest capacitor to Vref. The process is repeated until the Vcom of the DAC 325 equals the Vgnd, or the LSB capacitor is connected with the Vref, and the D0 of N-bit register 335 is updated accordingly. The N-bit register 335 subsequently generates an end of conversion (EOC) signal. Some examples of the conversions of the 'D' are further described with reference to FIGS. 4A and 4B.

It should further be noted that the sampling cycle is not a mandatory step for the conversion of the 'D', and instead of trapping −Vin (minus Vin) at the common terminal 355 and comparing the Vcom with Vgnd, comparison can also be made directly with Vs by directly feeding the Vs to the first input terminal 365 of the comparator 330. For instance, the different fractions of the Vref may be generated as Vcom for the approximation of the Vs, and Vcom may be compared with Vs to check whether the approximated voltage Vcom is less than or greater than Vs during the one or more redistribution cycles. Such example representation is described with reference to FIG. 4A.

It should be noted that by converting some MSBs by the flash ADC 305 and remaining bits using the SAR ADC 310 and pre-charging the first set of capacitors 345 to Vref during the conversion by the flash ADC 305, reduces instances of charging and discharging of the capacitors in the DAC 325 and thereby the switching current caused by the input code (the sampled analog signal Vs) is reduced. The INL error in the DAC 325 is further controlled. An example embodiment of reduced input dependent switching current in the capacitors in the DAC 325 is explained with reference to FIGS. 4A and 4B.

Figure 4A:
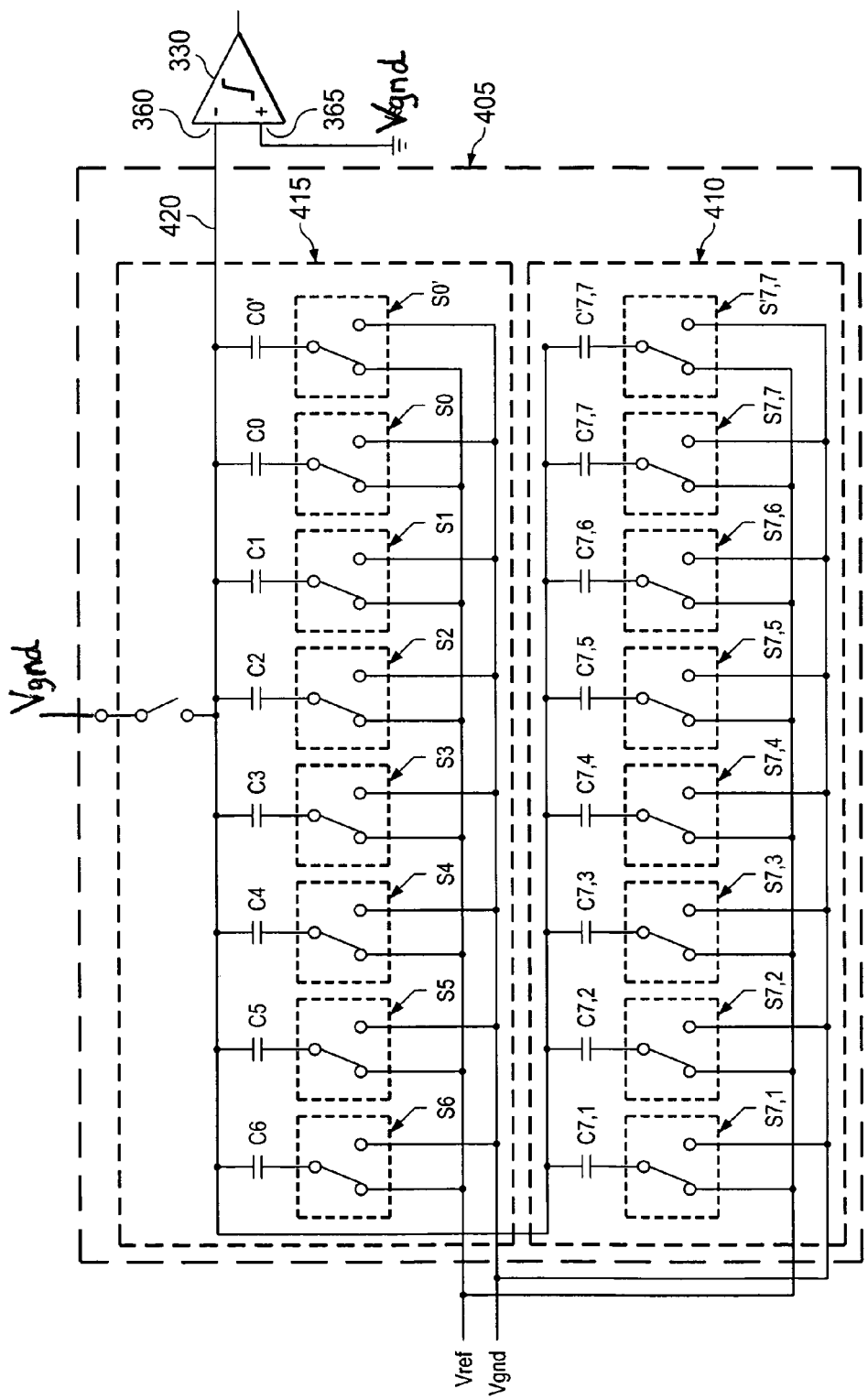
FIG. 4A is a circuit diagram of a capacitor DAC in the ADC of FIG. 3, in accordance with an example embodiment.

FIG. 4A is a circuit diagram of a capacitor DAC, for example a DAC 405, within an ADC, for example the ADC 300, in accordance with an embodiment. The DAC 405 is shown as an 8-bit capacitor DAC coupled to the comparator 330 (refer FIG. 3) at the second input terminal 360 of the comparator 330. The first input terminal 365 of the comparator 330 is configured to receive the sampled analog signal Vs. The DAC 405 includes a first set of capacitors 410 and a second set of capacitors 415. The first set of capacitors 410 represents the first MSB capacitor, for example $C_7$, of the 8-bit DAC 405. The first MSB capacitor $C_7$ has a binary weight of Vref/2, for example, all the capacitors of C7 are capable of generating a voltage Vref/s at Vcom. The first set of capacitors 410 includes a capacitor array of 7 capacitors with increasing binary weighted values (also referred to as binary weighted capacitors), for example capacitors $C_{7,1}$, $C_{7,2}$, $C_{7,3}$, $C_{7,4}$, $C_{7,5}$, $C_{7,6}$, and $C_{7,7}$ having binary weights as Vref/4, Vref/8, Vref/16, Vref/32, Vref/64, Vref/128, Vref/256, respectively, in addition to a dummy least significant bit (LSB) capacitor, for example $C'_{7,7}$ having a binary weight similar to that of $C_{7,7}$ as Vref/256. The binary weights of the capacitors $C_{7,1}$, $C_{7,2}$, $C_{7,3}$, $C_{7,4}$, $C_{7,5}$, $C_{7,6}$, $C_{7,7}$ and $C'_{7,7}$ together provide the binary weight Vref/2 that corresponds to the first MSB of the 'D'.

The second set of capacitors 415 also includes a capacitor array of 7 capacitors with increasing binary weighted values, for example capacitors $C_6$, $C_5$, $C_4$, $C_3$, $C_2$, $C_1$, and $C_0$ having binary weights as Vref/4, Vref/8, Vref/16, Vref/32, Vref/64, Vref/128, Vref/256, in addition to a dummy least significant bit (LSB) capacitor, for example $C_0'$ having a binary weight similar to that of $C_0$ as Vref/256. The individual capacitances of the first set of capacitors 410 are similar to corresponding capacitances of the second set of capacitors 415. In the DAC 405, a common terminal 420 is connected to first ends of the dummy LSB capacitors ($C'_{7,7}$ and $C_0'$) and the binary weighted capacitors ($C_{7,1}$ to $C_{7,7}$, and $C_6$ to $C_0$), and the common terminal 420 is coupled to the second input terminal 360 of the comparator 330. In the DAC 405, free terminals (second ends) of the binary weighted capacitors ($C_{7,1}$ to $C_{7,7}$ and $C_6$ to $C_0$) are selectively coupled to voltage rails Vref, or Vgnd based on respective switches, for example switches $S_{7,1}$, $S_{7,2}$, $S_{7,3}$, $S_{7,4}$, $S_{7,5}$, $S_{7,6}$, $S_{7,7}$, $S_6$, $S_5$, $S_4$, $S_3$, $S_2$, $S_1$, and $S_0$. The free terminals of the dummy capacitors $C'_{7,7}$ and $C_0'$ are also coupled to either Vref, or to the Vgnd based on respective switches $S'_{7,7}$ and S0'.

In an example, conversion by the ADC including a flash ADC and a SAR ADC including the DAC 405 can be understood in two phases. In a flash conversion phase, the M MSBs, for example, 3 MSBs of 'D' are converted by the flash ADC, for example the flash ADC 305, and in a SAR conversion phase, remaining N-M bits of the 'D' are converted by the SAR ADC, for example the SAR ADC 310, including the DAC 405. In an example embodiment, during the conversion of 3 MSBs by the flash ADC 305, the control signal (generated by SAR logic 340 of the digital engine 320) causes the capacitor $C_{7,1}$ to $C_{7,7}$ and $C'_{7,7}$ to be coupled (or pre-charged) to Vref. For instance, the switches $S_{7,1}$, $S_{7,2}$, $S_{7,3}$, $S_{7,4}$, $S_{7,5}$, $S_{7,6}$, $S_{7,7}$, and $S'_{7,7}$ are controlled by the control signal such that the free terminals of the capacitors $C_{7,1}$ to $C'_{7,7}$ are coupled to the Vref. Further, in the first cycle (during the conversion of the 3 MSBs by the flash ADC 305), the control signal also enables the capacitors $C_6$ to $C_0'$ of the second set of capacitors 415 to be coupled to the Vgnd by the switches $S_6$ to $S_0'$, respectively. Hence, during the conversion of the 3 MSBs of the 8-bit of 'D' corresponding to Vs by the flash ADC 305, such connections of the first set of capacitors 410 and the second set of capacitors 415 configures the Vcom to be equal to Vref/2. For instance, in one example embodiment, each capacitor of the first set of capacitors 410 is connected to Vref, and each capacitor of the second set of capacitors 415 is connected to Vgnd to thereby generating a voltage of Vref/2 as Vcom.

In a first cycle of the SAR conversion phase (after the conversion of the 3 MSBs are performed by the flash ADC 305), a voltage level corresponding to the digital signal is generated at the common terminal 420 of the DAC 405. As the voltage level of Vref/2 is already generated at the Vcom, so the voltage corresponding to the digital signal is generated as Vcom by disconnecting some capacitors of the first set of capacitors 410 from Vref or by connecting some capacitors of the second set of capacitors 415 to Vref. For example, if the voltage level corresponding to the digital signal is less than Vref/2, few selected capacitors of the first set of capacitors 410 may be connected to Vgnd by disconnecting them from Vref. Further, if the voltage level corresponding to the digital signal is more than Vref/2, few selected capacitors of the second set of capacitors 415 may be connected to Vref by disconnecting such capacitors from Vgnd. For instance, if the flash ADC 305 is a 3 bit flash ADC that provides conversion for 3 MSBs for the Vin, the switches $S_{7,1}$ to $S'_{7,7}$, $S_6$ and $S_5$ are controlled based on the control signal received from the digital engine 320 so as to generate the voltage (Vcom) corresponding to the digital signal at the common terminal 420.

In the subsequent cycles of the SAR conversion phase, the successive approximation of the N-M bits of N-bits of the digital output code 'D' are performed by the SAR ADC 310 including the DAC 405. For instance, the digital engine 320 is configured to generate the control signals to control connections of the second set of capacitors 415 so as to generate different fractions of Vref at the Vcom and compare the same with Vs to correctly approximate the Vs as per the SAR conversion algorithms knows in the art.

Some examples of conversion of the Vs to digital output code 'D' by the ADC 300 including the flash ADC 305 and the SAR ADC 310 including the DAC 405 are provided below. In a first example, the Vs is assumed to be 5.63 V and in a second example, Vs is assumed to be 2.535V, and the maximum value of Vin, for example, Vref is assumed to be equal to 8V.

In the first example, Vs is equal to 5.63 volts (V) and the Vref is equal to 8V. As the flash ADC 305 is the 3-bit flash ADC, the flash ADC 305 provides the digital signals (or codes) associated with a signal level corresponding to 5 V of the 5.63 V. For instance, in the flash conversion phase, the flash ADC 305 may convert the 3 MSBs so as to represent that the Vs is more than 5V. Accordingly, the flash ADC 305 outputs the digital signal as '101'. The digital signal '101' generated from the flash ADC 305 provides first 3 bits ($D_7D_6D_5$) of the digital output code 'D' and the remaining 5 bits are converted by the SAR ADC 310.

It should be noted that the voltage equivalent of the digital signal '101', for example 5V, is generated in the DAC 405 in the first cycle of the SAR conversion phase. As each capacitor ($C_{7,1}$ to $C'_{7,7}$) of the first set of capacitors 410 is already coupled to Vref (8V) during the flash conversion phase, and hence a voltage equivalent of 4V is already provided by the first set of capacitors 410 ($C_{7,1}$ to $C'_{7,7}$), and the remaining 1V is provided by connecting one or more capacitors of the second set of capacitors 415 to Vref so as to generate the voltage equivalent to 5V at the common terminal 420. In an example embodiment, the control signal is generated based on the digital signal to cause the switches $S_{7,1}$ to $S'_{7,7}$ and $S_6$ and S5 to generate 5V at the common terminal 420. In an example embodiment, if the SAR logic 340 determines that a voltage level corresponding to the digital signal (for example, 101) is greater than Vref/2, for example, 4V, the SAR logic 340 generates the control signal such that the connections of the switches $S_{7,1}$-$S'_{7,7}$ of the first set of capacitors 410 ($C_{7,1}$ to $C'_{7,7}$) are maintained in respective previous states, for example, the connections of free terminals of the capacitors ($C_{7,1}$ to $C'_{7,7}$) to the Vref is maintained. Further, the control signal also causes controlling the connections of the $S_6$ to $S_0'$ so as to generate additional 1V by the second set of capacitors 415 ($C_6$ to $C_0'$). For example, the switch $S_5$ causes the free terminal of the capacitor C5 to be connected to the Vref so as to generate the additional 1V at the common terminal 420. In this manner, the voltage equivalent of the digital signal (conversion performed by the flash ADC 305) is realized in the DAC 405. It should be noted that in subsequent cycles of the SAR conversion phase, the DAC 405 performs the conversion of next bits of digital output code 'D' till LSB so as to generate the digital output code 'D'.

Since the capacitors of the first set of capacitors 410 is already coupled to Vref, and the voltage equivalent of Vref/2 is already generated by such pre-charging, generating the voltage corresponding to the digital signal require relatively less number of events of charging/discharging of capacitors. For example, in case the voltage corresponding to the digital signal is less than Vref/2, only few capacitors of the first set of capacitors 410 are disconnected from Vref to Vgnd, and in case the voltage corresponding to the digital signal is greater than Vref/2, no new charging/discharging is done to the first set of capacitors 410 and only few capacitors of the second set of capacitors 415 are connected to Vref. Such pre-charging of the first set of capacitors 410 causes reduced input dependent switching current drawn from the reference voltage source.

In this example, at the end of the first cycle (for example, T1) of conversion by the flash ADC 305, the content of the N-bit register 335 is '101XXXXX', for example, the bits D7 D6 and D5 of 'D' are converted. Herein, the state of the bits D4 to D0 are represented as "X" and it can be either '0' or '1' depending upon the configuration of the N-bit register 335, and it can be customized. The N-bit register 335 is updated according to the digital signal to read as '101XXXXX'. In the first cycle of the SAR conversion phase, the control signal is provided to the DAC 405 so as to generate the voltage corresponding to the digital signal as the Vcom. As described, for generating the voltage corresponding to the '101' as Vcom, the control signal is configured such that the switches $S_{7,1}$ to $S'_{7,7}$ remain coupled to the Vref, the switch S6 remains coupled to the Vgnd, and only the switch S5 is disconnected from the Vgnd and coupled to the Vref. In a second cycle (for example, T2), the Vcom is determined as 5Vref/8 (equivalent to Vref/2+Vref/8) or 5V.

From the second cycle (T2) of the SAR conversion phase, the SAR ADC 310 begins the conversion for the remaining LSBs (for example, D4 to D0) of the digital output code 'D'. For instance, in the second cycle (T2), the SAR ADC 310 performs conversion for the bit D4 of the digital output code 'D'. Accordingly, the control signal causes the switch S4 to connect the C4 to Vref (by disconnecting the C4 from Vgnd and connecting to Vref), and a voltage equivalent of 5.5 V (a sum of 5V and Vref/16, where Vref is 8V) is generated as Vcom. Thereafter, the comparator 330 compares the Vcom (5.5V) to the Vs of 5.630V. As the Vcom is still less than Vs, the comparator 330 generates a high output signal (equal to logic 1). Based on the high output signal, the SAR logic 340 causes the N-bit register 335 to be updated as '1011XXXX' (where previous bits are maintained and next MSB is set), and connections of the $C_{7,1}$ to $C'_{7,7}$, C6, C5 and C4 are maintained.

In a third cycle (T3) of the SAR conversion phase, the SAR ADC 310 performs conversion for the bit D3 of the digital output code 'D'. For instance, the control signal causes the switch S3 to disconnect the capacitor $C_3$ from the ground and couple the capacitor $C_3$ to Vref. In this cycle, a voltage equivalent of 5.75 V (a sum of 5.5 V and Vref/32) is generated as Vcom. Thereafter, the comparator 330 compares the Vcom (5.75V) to the Vs of 5.63V. As the Vcom is more than the Vs, the comparator 330 generates a low output signal (equal to logic 0). Based on the low output signal, the SAR logic 340 causes the N-bit register 335 to be updated as '10110XXX' (where previous bits are maintained and next MSB is reset), and connections of the C7, C6, C5 and C4 are maintained, and the capacitors C3 is disconnected from Vref and connected to the Vgnd. Accordingly, the Vcom is brought back to 5.5V.

In a fourth cycle (T4) of the SAR conversion phase, the SAR ADC 310 performs conversion for the bit D2 of the digital output code 'D'. For instance, the control signal causes the switch S2 to disconnect the capacitor $C_2$ from the ground and couple the capacitor $C_2$ to Vref. In this cycle, a voltage equivalent of 5.625 V (a sum of 5.5 V and Vref/64) is generated as Vcom. Thereafter, the comparator 330 compares the Vcom (5.625V) to the Vs of 5.63V. As the Vcom is less than the Vs, the comparator 330 generates a high output signal (equal to logic 1). Based on the high output signal, the SAR logic 340 causes the N-bit register 335 to be updated as '101101XX' (where previous bits are maintained and next MSB is set), and connections of the C7, C6, C5, C4 and C3 are maintained, and the connection of the capacitors C2 with Vref is also maintained so as to generate the Vcom as equal to 5.625V.

In a fifth cycle (T5) of the SAR conversion phase, the SAR ADC 310 performs conversion for the bit D1 of the digital output code 'D'. For instance, the control signal causes the switch S1 to disconnect the capacitor $C_1$ from the ground and couple the capacitor $C_1$ to Vref. In this cycle, a voltage equivalent of 5.6975 V (a sum of 5.625 V and Vref/128) is generated as Vcom. Thereafter, the comparator 330 compares the Vcom (5.6975V) to the Vs of 5.63V. As the Vcom is greater than the Vs, the comparator 330 generates a low output signal (equal to logic 0). Based on the low output signal, the SAR logic 340 causes the N-bit register 335 to be updated as '1011010X' (where previous bits are maintained and next MSB is reset), and connections of the C7, C6, C5, C4, C3 and C2 are maintained, and the connection of the capacitors C1 is disconnected from Vref and is connected to Vgnd so as to generate the Vcom as equal to 5.625V.

In a sixth cycle (T6) of the SAR conversion phase, the SAR ADC 310 performs conversion for the bit D0 of the digital output code 'D'. For instance, the control signal causes the switch S0 to disconnect the capacitor $C_0$ from the ground and couple the capacitor $C_0$ to Vref. In this cycle, a voltage equivalent of 5.65625 V (a sum of 5.625 V and Vref/256) is generated as Vcom. Thereafter, the comparator 330 compares the Vcom (5.65625V) to the Vs of 5.63V. As the Vcom is greater than the Vs, the comparator 330 generates a low output signal (equal to logic 0). Based on the low output signal, the SAR logic 340 causes the N-bit register 335 to be updated as '10110100' (where previous bits are maintained and next MSB is reset), and connections of the C7, C6, C5, C4, C3 and C2 are maintained, and the connection of the capacitors C0 is disconnected from Vref and is connected to Vgnd so as to generate the Vcom as equal to 5.625V. In this manner, the best approximation of the Vs that is 5.625V is generated from the DAC 405, and the N-bits of the digital output code 'D' are provided by the N-bit register 335 as 10110100. Accordingly, the digital output code 10110100 is a digital conversion of the analog value of the Vs of 5.63V. In an example embodiment, SAR logic 340 outputs an end of conversion (EOC) signal upon the end of the sixth cycle (T6), and provides the digital output code 'D' as 10110000 which is the 8-bit ADC output for a Vin of 5.63V.

In a second example, Vs is equal to 2.535V and Vref is equal to 8V. In the flash conversion phase, the flash ADC 305 provides conversion of the three most significant bits D7 D6 and D5 of the digital output code 'D'. For example, the flash ADC 305 provides a digital signal corresponding to the digital code 010 and the content of the N-bit register 335 is '010XXXXX'. It should be noted that the voltage equivalent of the '010', for example, 2V is generated in the DAC 405 and after this generation, the conversion of the remaining bits (D4-D0) is performed by the SAR ADC 310 in the SAR conversion phase.

In a first cycle (T1) of the SAR conversion phase, a voltage corresponding to the digital signal is generated as the Vcom. As each capacitor of the first set of capacitors 410 ($C_{7,1}$ to $C'_{7,7}$) is already coupled to Vref (8V), and hence a voltage equivalent of 4V is already provided by the first set of capacitors 410 ($C_{7,1}$ to $C'_{7,7}$), few selective capacitors of the first set of capacitors 410 are disconnected from Vref and coupled to the Vgnd to generate the equivalent voltage of 2V at Vcom. In an example embodiment, the control signal is generated based on the digital signal to cause the switches $S_{7,1}$-$S'_{7,7}$ and $S_6$ to $S_0'$ to generate the 2V at the common terminal 420. In an example embodiment, if the SAR logic 340 determines that a voltage level corresponding to the digital signal (for example, 010) is less than Vref/2, for example, 4V, the SAR logic 340 generates the control signal such that some connections of the switches $S_{7,1}$-$S'_{7,7}$ of the first set of capacitors 410 ($C_{7,1}$ to $C'_{7,7}$) are changed so as to generate the voltage equivalent of 2V at the Vcom. For instance, the control signal is configured to cause the switch $S_{7,1}$ to disconnect the $C_{7,1}$ from Vref and connect to Vgnd, and maintain the connections of the rest of the switches $S_{7,2}$-$S'_{7,7}$ in order to generate the 2V at the Vcom. Alternatively, the control signal is configured to cause the switch $S_{7,1}$ to maintain the connection of $C_{7,1}$ with the Vref, and disconnect the rest of the switches $S_{7,2}$-$S'_{7,7}$ from Vref to Vgnd.

From a second cycle (T2) of the SAR conversion phase, the SAR ADC 310 begins the conversion for the remaining LSBs (for example, D4 to D0) of the digital output code 'D'. For instance, in the second cycle (T2), the SAR ADC 310 performs conversion for the bit D4 of the digital output code 'D'. Accordingly, the control signal causes the switch S4 to connect the C4 to Vref (by disconnecting the C4 from Vgnd and connecting to Vref), and a voltage equivalent of 2.5 V (a sum of 2V and Vref/16, where Vref is 8V) is generated as Vcom. Thereafter, the comparator 330 compares the Vcom (2.5V) to the Vs of 2.535V. As the Vcom is still less than Vs, the comparator 330 generates a high output signal (equal to logic 1). Based on the high output signal, the SAR logic 340 causes the N-bit register 335 to be updated as '0101XXXX' (where previous bits are maintained and next MSB is set), and connections of the $C_{7,1}$ to $C'_{7,7}$, C6, C5 and C4 are maintained.

In a third cycle (T3) of the SAR conversion phase, the SAR ADC 310 performs conversion for the bit D3 of the digital output code 'D'. Accordingly, the control signal causes the switch S3 to connect the C3 to Vref (by disconnecting the C3 from Vgnd and connecting to Vref), and a voltage equivalent of 2.75 V (a sum of 2.5V and Vref/32, where Vref is 8V) is generated as Vcom. Thereafter, the comparator 330 compares the Vcom (2.75V) to the Vs of 2.535V. As the Vcom is greater than Vs, the comparator 330 generates a low output signal (equal to logic 0). Based on the low output signal, the SAR logic 340 causes the N-bit register 335 to be updated as '01010XXX' (where previous bits are maintained and next MSB is reset), and connections of the $C_{7,1}$ to $C'_{7,7}$, C6, C5 and C4 are maintained and the C3 is connected to Vgnd from Vref, and Vcom is brought back to 2.5V.

In a fourth cycle (T4) of the SAR conversion phase, the SAR ADC 310 performs conversion for the bit D2 of the digital output code 'D'. Accordingly, the control signal causes the switch S2 to connect the C2 to Vref (by disconnecting the C2 from Vgnd and connecting to Vref), and a voltage equivalent of 2.625 V (a sum of 2.5V and Vref/64, where Vref is 8V) is generated as Vcom. Thereafter, the comparator 330 compares the Vcom (2.625V) to the Vs 2.535V. As the Vcom is greater than Vs, the comparator 330 generates a low output signal (equal to logic 0). Based on the low output signal, the SAR logic 340 causes the N-bit register 335 to be updated as '010100XX' (where previous bits are maintained and next MSB is reset), and connections of the $C_{7,1}$ to $C'_{7,7}$, C6, C5, C4 and C3 are maintained and the C2 is connected to Vgnd from Vref, and the Vcom is brought back to 2.5V.

In a fifth cycle (T5) of the SAR conversion phase, the SAR ADC 310 performs conversion for the bit D1 of the digital output code 'D'. Accordingly, the control signal causes the switch S1 to connect the C1 to Vref (by disconnecting the C1 from Vgnd and connecting to Vref), and a voltage equivalent of 2.5625 V (a sum of 2.5V and Vref/128, where Vref is 8V) is generated as Vcom. Thereafter, the comparator 330 compares the Vcom (2.625V) to the Vs 2.535V. As the Vcom is greater than Vs, the comparator 330 generates a low output signal (equal to logic 0). Based on the low output signal, the SAR logic 340 causes the N-bit register 335 to be updated as '0101000X' (where previous bits are maintained and next MSB is reset), and connections of the $C_{7,1}$ to $C'_{7,7}$, C6, C5, C4, C3 and C2 are maintained and the C1 is connected to Vgnd from Vref, and the Vcom is brought back to 2.5V.

In a sixth cycle (T6) of the SAR conversion phase, the SAR ADC 310 performs conversion for the bit D0 of the digital output code 'D'. Accordingly, the control signal causes the switch S0 to connect the C0 to Vref (by disconnecting the C0 from Vgnd and connecting to Vref), and a voltage equivalent of 2.53125V (a sum of 2.5V and Vref/256, where Vref is 8V) is generated as Vcom. Thereafter, the comparator 330 compares the Vcom (2.53125V) to the Vs 2.535V. As the Vcom is less than Vs, the comparator 330 generates a high output signal (equal to logic 1). Based on the high output signal, the SAR logic 340 causes the N-bit register 335 to be updated as '01010001' (where previous bits are maintained and next MSB is set), and connections of the $C_{7,1}$ to $C'_{7,7}$, C6, C5, C4, C3, C2, C1 and C0 are maintained and the Vcom is equal 2.53125V. In this manner, the best approximation of the Vs (2.535V) that is 2.53125 is generated by the DAC 405, and the digital output code 'D' is provided by the N-bit register 335 as '01010001'. Accordingly, the digital output code 01010001 is a digital conversion of the analog value of the Vs of 2.535V. In an example embodiment, SAR logic 340 outputs an end of conversion (EOC) signal upon the end of the sixth cycle (T6), and provides the digital output code 'D' as '01010001' which is the 8-bit ADC output for a Vin of 2.535V.

The DAC 405 described in reference to FIG. 4A provides approximation of Vs in the DAC 405 by comparing the Vcom to Vs, and in this example embodiment, there is no sampling/hold phases of the Vs before initiating the flash conversion phase and the SAR conversion phase. In another example embodiment of the DAC 325, a DAC 455 is shown in FIG. 4B, where the Vs is sampled and trapped at a common terminal 470, and the voltage at the common terminal 470 is compared with Vgnd that is fed to the first input terminal 365 of the comparator 330.

Figure 4B:
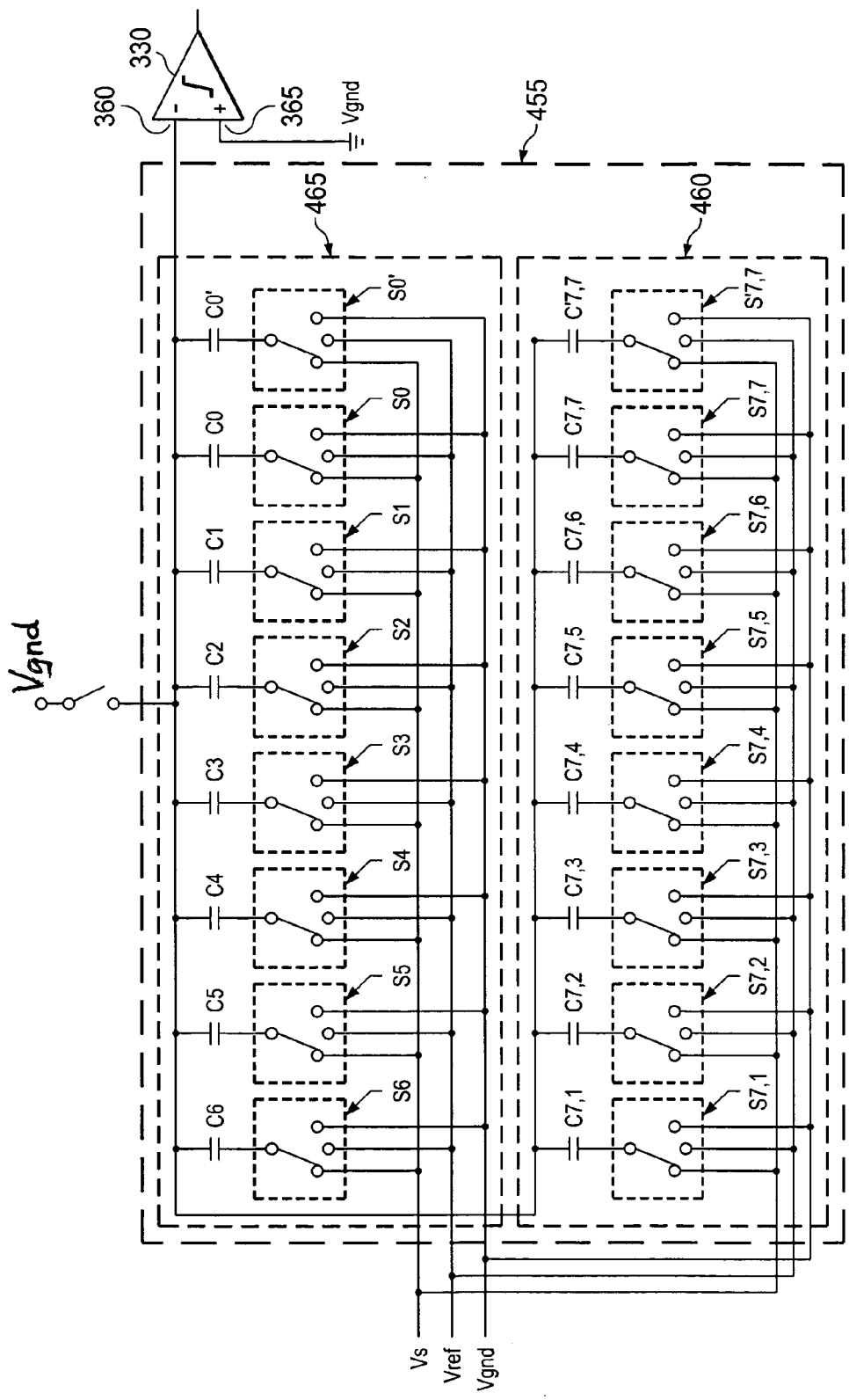
FIG. 4B is a circuit diagram of a capacitor DAC in the ADC of FIG. 3, in accordance with another example embodiment.

As shown in FIG. 4B, the DAC 455 includes a first set of capacitors 460 and a second set of capacitors 465. In the sampling phase, −Vs is trapped at the common terminal 470, hence the voltage at the common terminal 470 (Vcom) is equal to −Vs+n.Vref, where n.Vref is a voltage contributed by the connections of the capacitors of first set of capacitors 460 and the second set of capacitors 465 to Vref. In this example embodiment, the Vcom is compared with the Vgnd during the SAR conversion phase. Accordingly, the ADC 300 employing the flash ADC 305 and the SAR ADC 310 including the DAC 455 performs the sampling and hold phase, the flash conversion phase and the SAR conversion phase. The flash conversion phase and the SAR conversion phase are performed as described with reference to FIG. 4A.

FIG. 5 is a graphical representation illustrating variation of average charge drawn (or switching current used) by example capacitor DACs in example ADCs with respect to an analog input signal Vin. A plot 500 between the average charge drawn by capacitor DAC of an ADC (plotted on Y-axis 505) against the analog input signal Vin (plotted on X-axis 510) is shown. The plot 500 is depicted corresponding to an example scenario where the charge drawn by the ADC varies with respect to variation of the analog input signal Vin received by the ADC in different scenarios. In an example scenario, the range of the analog input signal Vin on X-axis 510 varies between sampling levels 0 to 255 and the range of the charge drawn by the ADC on Y-axis 505 varies from 0 to 6, where 0 to 6 are normalized values of the charge in Coulomb (C). The plot 500 is shown to depict four scenarios, for example a first scenario where the ADC employs a binary search algorithm to convert the Vin to a digital output code 'D' (as illustrated by a waveform 515), a second scenario where the ADC employs a charge recycling to convert the Vin to a digital output code 'D' (as illustrated by a waveform 520), a third scenario where the ADC (for example, the ADC 100 of FIG. 1) employs a flash ADC as a front end and a capacitor DAC (for example, the flash ADC 110 in FIG. 1 and the capacitor DAC 120 in FIG. 1 and FIG. 2) to convert the Vin to a digital output code 'D' (as illustrated by a waveform 525), and a fourth scenario where the ADC of the present disclosure (for example, the ADC 300 of FIG. 3) employs a flash ADC and a capacitor DAC (for example, the flash ADC 305 and the DAC 325) employing charge recycling and pre-charging the first set of capacitors during conversion by the flash ADC to convert the Vin to a digital output code 'D' (as illustrated by a waveform 530).

In the first scenario depicted by the waveform 515 on the plot 500, where the ADC employs a binary search algorithm to convert the Vin to a digital output code 'D', the waveform 515 depicts a fall in the charge drawn by the ADC with respect to the increase in the analog input signal Vin. As illustrated by the waveform 515, the charge drawn by the ADC gradually varies (for example, from reference point 5 to reference point 2) with an increase in analog input signal Vin (for example, from 0 to 255 sampling levels). In an example, a maximum charge drawn by the ADC for the first scenario can be equivalent to $((5*2^{2N-1}-3*2^{N}-1)/3*2^{N})$ CVref and a difference between the maximum charge and a minimum charge drawn by the ADC for the first scenario can be equivalent to $(2^{N-1}-1)$ CVref. Herein, C represents unit capacitance corresponding to the LSB capacitor in the ADC, and Vref is a maximum voltage level of the Vin. In the second scenario depicted by the waveform 520, where the ADC employs a charge recycling to convert the Vin to a digital output code 'D', the waveform 520 depicts a variation of the charge drawn by the ADC with respect to the Vin. As illustrated by the waveform 520, the charge drawn by the ADC gradually varies (for example, a rise from reference point 2 to 3 and a fall from reference point 3 to 2) with an increase in Vin (for example, from 0 to 255 sampling levels). In an example, a maximum charge drawn by the ADC for the second scenario can be equivalent to $((2^{2N}+3*2^{2N-3}-3*2^{N-1}-1)/3*2^{N})$ CVref, and a difference between the maximum charge and a minimum charge drawn by the ADC for the second scenario can be equivalent to $(2^{N-3}-0.5)$ CVref.

In the third scenario depicted by the waveform 525 on the plot 500, where the ADC employs the flash ADC as the front-end along with the capacitor DAC to convert the Vin to a digital output code 'D', the waveform 525 depicts a variation of the charge drawn by the ADC with respect to the Vin. As illustrated by the waveform 525, the charge drawn by the ADC gradually varies (for example, rises from reference point 0 to 1.5 and fall from reference point 1.5 to 0) with an increase in Vin (for example, from 0 to 255 sampling levels). In an example, a maximum charge drawn by the ADC for the third scenario can be equivalent to $2^{N-2}$CVref and a difference between the maximum charge and a minimum charge drawn by the ADC for the third scenario can be equivalent to $2^{N-2}$CVref. In the fourth scenario depicted by the waveform 530, where the ADC employs a flash ADC and a capacitor DAC (for example, the flash ADC 305 and the DAC 325) and employing charge recycling and pre-charging the first set of capacitors during conversion by the flash ADC to convert the Vin to a digital output code 'D', the waveform 530 depicts variation of the charge drawn by the ADC in short intervals with respect to the analog input signal Vin. As illustrated by the waveform 530, the charge drawn by the ADC decreases with an increase in analog input signal Vin (for example, a first rise and fall between reference points 1.5 and 2 for 0 to 125 sampling levels and a second rise and fall between reference points 1.5 and 2 for 125 to 255 sampling levels). In an example, a maximum charge drawn by the ADC for the second scenario can be equivalent to $(2^{N-2}+2^{N-3})$ CVref and a difference between the maximum charge and a minimum charge drawn by the ADC for the fourth scenario can be equivalent to $2^{N-4}$ CVref. As illustrated in FIG. 5, the waveform 530 has a reduced charge drawn by the ADC as compared with the waveform 515, the waveform 520, and the waveform 525. Accordingly, the example embodiments of the present disclosure (for example, as shown by the waveform 530) provide reduced variation in charges drawn from the reference voltage source by the capacitor DAC, as compared to existing techniques.

Figure 6:
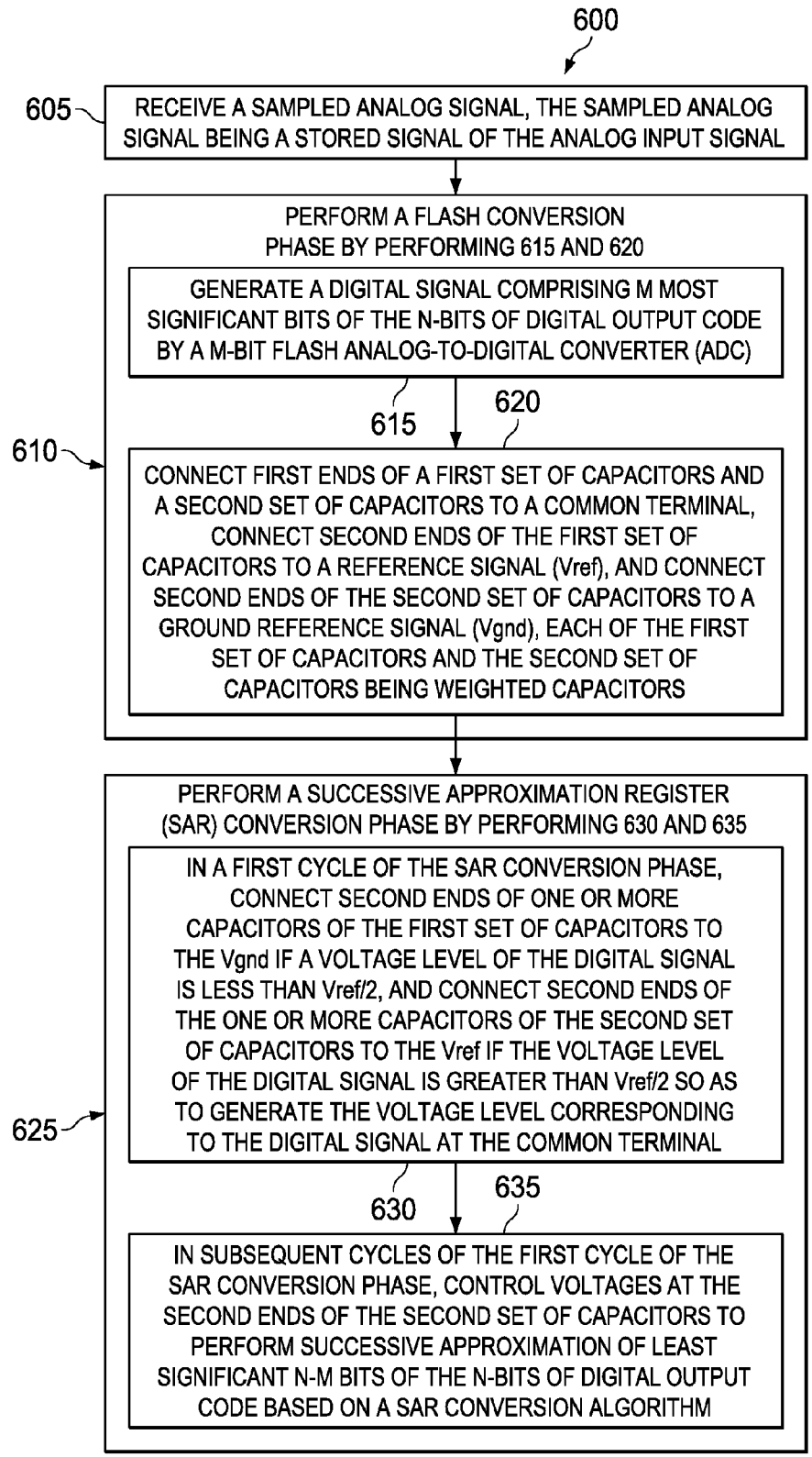
FIG. 6 is a flow diagram illustrating a method of converting an analog input signal into N-bits of digital output code, in accordance with an example embodiment.

FIG. 6 is a flow diagram illustrating a method of converting an analog input signal into N-bits of digital output code, in accordance with an example embodiment. References to FIGS. 1 to 5 will be made for the description of example embodiment of FIG. 6, however, such references should not be considered limiting to the scope of the present disclosure.

At 605, the method 600 includes receiving a sampled analog signal. In an example, the sampled analog signal is a stored signal of the analog input signal. For instance, a suitable circuit such as a sample and hold circuit (for example, the S/H circuit 105 of FIG. 1) is configured to sample and hold an analog input signal (referred to as 'Vin') and provide the sampled analog signal (referred to as 'Vs'), where the Vs is a temporarily stored signal of the analog input signal Vin till the Vs is converted into the N-bits of digital output code 'D'.

At 610, a flash conversion phase is performed. In an example, the flash conversion phase is performed at least by operations 615 and 620. At 615, the method 600 includes generating a digital signal including most significant M-bits of the N-bits of digital output code by an M-bit flash analog-to-digital converter (ADC). An example of the M-bit flash ADC is the M-bit flash ADC 305. At 620, the method 600 includes connecting first ends of a first set of capacitors and a second set of capacitors to a common terminal, connecting second ends of the first set of capacitors to a reference signal (Vref), and connecting second ends of the second set of capacitors to a ground reference signal (Vgnd). Each of the first set of capacitors (for example, the capacitors 345 or 410) and the second set of capacitors (350 or 415) is binary weighted capacitors.

At 625, a SAR conversion phase is performed. In an example, the SAR conversion phase is performed at least by operations 630 and 635. In a first cycle of the SAR conversion phase (at 630), second ends of one or more capacitors of the first set of capacitors are connected to the Vgnd if a voltage level corresponding to the digital signal (for example, a voltage level of the digital signal) including the most significant M-bits is less than Vref/2. Further, at 630, second ends of one or more capacitors of the second set of capacitors are connected to the Vref if the voltage level of the digital signal is greater than Vref/2 so as to generate the voltage level corresponding to the digital signal at the common terminal. Further, at 635, in subsequent cycles of the first cycle of the SAR conversion phase, voltages at the second ends of the second set of capacitors is controlled to perform successive approximation of the least significant N-M bits of the N-bits of digital output code based on a SAR conversion algorithm. Various example embodiments of the subsequent cycles of the SAR conversion phase are explained with reference to FIGS. 2 to 5, and hence are not described herein again for the sake of brevity.

Without in any way limiting the scope, interpretation, or application of the claims appearing below, advantages of one or more of the example embodiments disclosed herein include reducing the input dependent capacitor DAC switching current in a SAR ADC by generating M MSBs by a flash ADC and remaining bits by a SAR ADC that includes a capacitor DAC having split arrays of capacitors. The split arrays of capacitors include a first set of capacitors and a second set of capacitors. The first set of capacitors of the capacitor DAC are pre-charged to a reference voltage during conversion of the M most significant bits of a sampled analog signal to the digital signal. The pre-charging of the first set of capacitors reduces instances of input (sampled analog signal) dependent switching of the capacitors as one or more capacitors of the first set of capacitors are switched to 0V only if the digital signal is lesser than Vref/2. Further, the unnecessary charging and discharging of the capacitors is reduced by switching one or more capacitors of the second set of capacitors to Vref if the digital signal is greater than the Vref/2. A control signal is configured to control the connections of the capacitors until the DAC voltage equals the sampled analog signal Vin, thus reducing variation in the input dependent capacitor DAC switching current and the INL error.

Although the present disclosure has been described with reference to specific example embodiments, it is noted that various modifications and changes can be made to these embodiments without departing from the broad spirit and scope of the present disclosure. For example, the various circuits, etc., described herein can be enabled and operated using hardware circuitry (for example, complementary metal oxide semiconductor (CMOS) based logic circuitry), firmware, software and/or any combination of hardware, firmware, and/or software (for example, embodied in a machine-readable medium). For example, the various electrical structures and methods can be embodied using transistors, logic gates, and electrical circuits (for example, application specific integrated circuit (ASIC) circuitry and/or in Digital Signal Processor (DSP) circuitry).

Also, techniques, devices, subsystems and methods described and illustrated in the various embodiments as discrete or separate can be combined or integrated with other systems, modules, techniques, or methods without departing from the scope of the present disclosure. Other items shown or discussed as directly coupled or communicating with each other can be coupled through some interface or device, such that the items can no longer be considered directly coupled to each other but can still be indirectly coupled and in communication, whether electrically, mechanically, or otherwise, with one another. Other examples of changes, substitutions, and alterations ascertainable by one skilled in the art, upon or subsequent to studying the example embodiments disclosed herein, can be made without departing from the spirit and scope of the present disclosure.

It is noted that the terminology "coupled to" does not necessarily indicate a direct physical relationship. For example, when two components are described as being "coupled to" one another, there may be one or more other devices, materials, etc., that are coupled between, attaching, integrating, etc., the two components. As such, the terminology "coupled to" shall be given its broadest possible meaning unless otherwise indicated.

It should be noted that reference throughout this specification to features, advantages, or similar language does not imply that all of the features and advantages should be or are in any single embodiment. Rather, language referring to the features and advantages can be understood to mean that a specific feature, advantage, or characteristic described in connection with an embodiment can be included in at least one embodiment of the present disclosure. Thus, discussions of the features and advantages, and similar language, throughout this specification can, but do not necessarily, refer to the same embodiment.

Various embodiments of the present disclosure, as discussed above, can be practiced with steps and/or operations in a different order, and/or with hardware elements in configurations which are different than those which are disclosed. Therefore, although the disclosure has been described based upon these example embodiments, it is noted that certain modifications, variations, and alternative constructions can be apparent and well within the spirit and scope of the disclosure. Although various example embodiments of the present disclosure are described herein in a language specific to structural features and/or methodological acts, the subject matter defined in the appended claims is not necessarily limited to the specific features or acts described above. Rather, the specific features and acts described above are disclosed as example forms of implementing the claims.

What is claimed is:

1. An analog-to-digital converter (ADC) for converting an analog input signal into N-bits of digital output code, the ADC comprising:
   an M-bit flash ADC configured to receive a sampled analog signal and to output a digital signal comprising most significant M-bits of the N-bits of digital output code in a flash conversion phase, the sampled analog signal being a stored signal of the analog input signal, M and N being integers; and
   an N-bit successive approximation register (SAR) ADC comprising:
      a capacitor digital-to-analog converter (DAC) comprising a first set of capacitors and a second set of capacitors, each of the first set of capacitors and the second set of capacitors being weighted capacitors such that the capacitors of the first set of capacitors all have respectively different capacitance values and the capacitors of the second set of capacitors all have respectively different capacitance values, first ends of each capacitor of the first set of capacitors and the second set of capacitors coupled to a common terminal; and
      a digital engine coupled to the M-bit flash ADC and the capacitor DAC for providing the N-bits of digital output code in a SAR conversion phase based on the digital signal and a voltage (Vcom) at the common terminal, the digital engine configured to:
         in the flash conversion phase, generate the most significant M-bits of the N-bits of digital output code based on the digital signal received from the M-bit flash ADC, connect second ends of the first set of capacitors to a reference signal (Vref), and connect second ends of the second set of capacitors to a ground reference signal (Vgnd);
         in a first cycle of the SAR conversion phase, connect second ends of one or more capacitors of the first set of capacitors to the Vgnd if a voltage level corresponding to the digital signal is less than Vref/2, and connect second ends of one or more capacitors of the second set of capacitors to the Vref if the voltage level corresponding to the digital signal is greater than Vref/2 so as to generate the voltage level corresponding to the digital signal as the Vcom; and
         in subsequent cycles of the first cycle of the SAR conversion phase, control voltage levels at the second ends of the second set of capacitors to perform successive approximation of least significant N-M bits of the N-bits of digital output code based on a SAR conversion algorithm.

2. The ADC of claim 1, wherein the capacitor DAC further comprises a plurality of switches, each switch being in one-to-one correspondence with capacitors of the first set of capacitors and the second set of capacitors, each switch configured to selectively connect a second end of respective capacitor to one of the Vref and the Vgnd based on a control signal received from the digital engine, wherein the capacitor DAC is configured to generate the Vcom based on connections of the plurality of switches.

3. The ADC of claim 2, wherein the N-bit SAR ADC further comprises:
   a comparator comprising a first input terminal and a second input terminal, the first input terminal coupled to the sampled analog signal and the second input terminal coupled to the common terminal, the comparator configured to provide an output signal based on difference of the sampled analog signal and the Vcom, and the digital engine is further configured to perform the successive approximation of the least significant N-M bits of the N-bits of digital output code based on the output signal.

4. The ADC of claim 1, wherein the capacitor DAC further comprises a plurality of switches, each switch being in one-to-one correspondence with capacitors of the first set of capacitors and the second set of capacitors, each switch configured to selectively connect a second end of respective capacitor to one of the sampled analog signal, the Vref and the Vgnd based on a control signal received from the digital engine, wherein the capacitor DAC is configured to generate the Vcom based on connections of the plurality of switches.

5. The ADC of claim 1, wherein the N-bit SAR ADC further comprises:
   a comparator comprising a first input terminal and a second input terminal, the first input terminal coupled to the Vgnd and the second input terminal coupled to the common terminal, the comparator configured to provide an output signal based on a difference of the Vgnd and the Vcom, and the digital engine is further configured to perform the successive approximation of the least significant N-M bits of the N-bits of digital output code based on the output signal.

6. The ADC of claim 1 further comprising:
   a sample and hold circuit configured to sample and hold the analog input signal to output the sampled analog signal.

7. The ADC of claim 1, wherein the first set of capacitors and the second set of capacitors of the capacitor DAC comprises a first array of binary weighted capacitors and a second array of binary weighted capacitors, respectively, wherein capacitances of the first array of binary weighted capacitors are equal to corresponding capacitances of the second array of binary weighted capacitors.

8. The ADC of claim 7, wherein the first set of capacitors comprises a dummy least significant bit (LSB) capacitor, and wherein a capacitance of the dummy LSB capacitor is equal to a LSB capacitor of the first array of binary weighted capacitors.

9. The ADC of claim 7, wherein the second set of capacitors comprises a dummy least significant bit (LSB) capacitor, and wherein a capacitance of the dummy LSB capacitor is equal to a LSB capacitor of the second array of binary weighted capacitors.

10. The ADC of claim 1, wherein the digital engine comprises:
   a SAR logic configured to generate a control signal to control connections of the second ends of the first set of capacitors and the second set of capacitors based on the SAR conversion algorithm; and an N-bit register configured to store the N-bits of digital output code.

11. The ADC of claim 1, wherein the Vref comprises a maximum voltage level of the analog input signal.

12. The ADC of claim 1 further comprising:
a reference voltage source to generate the reference signal.

13. A method of converting an analog input signal into N-bits of digital output code, the method comprising:
receiving a sampled analog signal, the sampled analog signal being a stored signal of the analog input signal;
performing a flash conversion phase by:
generating a digital signal comprising most significant M-bits of the N-bits of digital output code by a M-bit flash analog-to-digital converter (ADC); and
connecting first ends of a first set of capacitors and a second set of capacitors to a common terminal, connecting second ends of the first set of capacitors to a reference signal (Vref), and connecting second ends of the second set of capacitors to a ground reference signal (Vgnd), each of the first set of capacitors and the second set of capacitors being weighted capacitors such that the capacitors of the first set of capacitors all have respectively different capacitance values and the capacitors of the second set of capacitors all have respectively different capacitance values; and
performing a successive approximation register (SAR) conversion phase by:
in a first cycle of the SAR conversion phase, connecting second ends of one or more capacitors of the first set of capacitors to the Vgnd if a voltage level corresponding to the digital signal is less than Vref/2, and connecting second ends of the one or more capacitors of the second set of capacitors to the Vref if the voltage level corresponding to the digital signal is greater than Vref/2 so as to generate the voltage level corresponding to the digital signal at the common terminal; and
in subsequent cycles of the first cycle of the SAR conversion phase, controlling voltages at the second ends of the second set of capacitors to perform successive approximation of least significant N-M bits of the N-bits of digital output code based on a SAR conversion algorithm.

14. The method of claim 13 further comprising:
generating a control signal for:
connecting the second ends of the first set of capacitors to the Vref, and connecting the second ends of the second set of capacitors to the Vgnd in the flash conversion phase; and
connecting the second ends of the one or more capacitors of the first set of capacitors to the Vgnd if the voltage level is less than Vref/2, and connecting the second ends of the one or more capacitors of the second set of capacitors to the Vref if the voltage level is greater than Vref/2.

15. The method of claim 14 further comprising:
controlling connections of a plurality of switches based on the control signal, each switch of the plurality of switches being in one-to-one correspondence with capacitors of the first set of capacitors and the second set of capacitors, each switch configured to selectively connect a second end of respective capacitor to one of the Vref and the Vgnd based on the control signal.

16. The method of claim 14 further comprising:
comparing the sampled analog signal and a voltage at the common terminal to provide an output signal; and
performing the successive approximation of the least significant N-M bits of the N-bits of digital output code based on the output signal.

17. The method of claim 14 further comprising:
controlling connections of a plurality of switches based on the control signal, each switch of the plurality of switches being in one-to-one correspondence with capacitors of the first set of capacitors and the second set of capacitors, each switch configured to selectively connect a second end of respective capacitor to one of the sampled analog signal, the Vref and the Vgnd based on the control signal.

18. The method of claim 17 further comprising:
comparing the Vgnd and a voltage at the common terminal to provide an output signal; and
performing the successive approximation of the least significant N-M bits of the N-bits of digital output code based on the output signal.

19. The method of claim 13 further comprising:
performing a sample and hold of the analog input signal to output the sampled analog signal.

20. The method of claim 13, wherein the first set of capacitors and the second set of capacitors comprises a first array of binary weighted capacitors and a second array of binary weighted capacitors, respectively, wherein capacitances of the first array of binary weighted capacitors are equal to corresponding capacitances of the second array of binary weighted capacitors.

* * * * *